United States Patent [19]

Ozawa

[11] Patent Number: 4,814,040
[45] Date of Patent: Mar. 21, 1989

[54] METHOD OF CONNECTING ELECTRONIC ELEMENT TO BASE PLATE

[75] Inventor: Kazuhito Ozawa, Nara, Japan

[73] Assignee: Sharp Kabushiki Kaisha, Osaka, Japan

[21] Appl. No.: 174,715

[22] Filed: Mar. 29, 1988

[30] Foreign Application Priority Data

Apr. 3, 1987 [JP] Japan .................................. 62-83399

[51] Int. Cl.⁴ ............................ C23F 1/02; B44C 1/22; C03C 15/00; C03C 25/06
[52] U.S. Cl. ....................................... 156/634; 29/846; 156/656; 156/659.1; 156/902; 427/96
[58] Field of Search ............ 156/629, 634, 656, 659.1, 156/902, 283, 306.6, 306.9; 29/846; 427/96, 98

[56] References Cited

U.S. PATENT DOCUMENTS

| | | | |
|---|---|---|---|
| 2,739,881 | 3/1956 | Kepple | 156/901 X |
| 4,157,932 | 6/1979 | Hirata | 156/310 |
| 4,540,463 | 9/1985 | Kakuhashi et al. | 156/630 |

*Primary Examiner*—William A. Powell
*Attorney, Agent, or Firm*—Flehr, Hohbach, Test, Albritton & Herbert

[57] ABSTRACT

An electronic element is connected to a base plate provided with a metallic pattern and a conductive resist layer superposed thereon by a thermal compression process with an adhesive layer sandwiched between the element and the base plate. The adhesive layer contains many metallic particles which are larger than the layer thickness of the resist such that these metallic particles penetrate the resist layer and invade the metallic pattern by the thermal compression process.

10 Claims, 2 Drawing Sheets

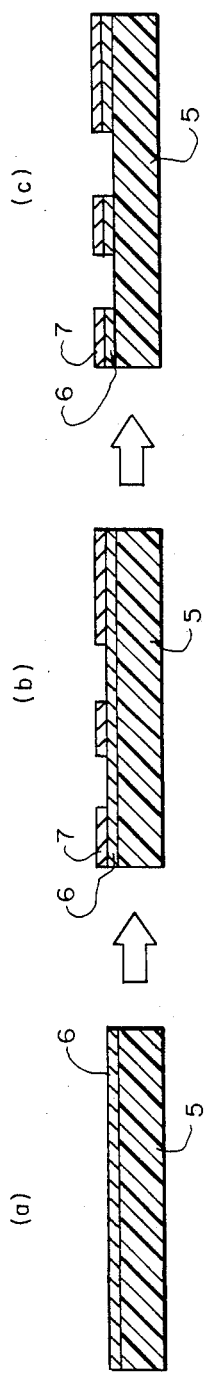
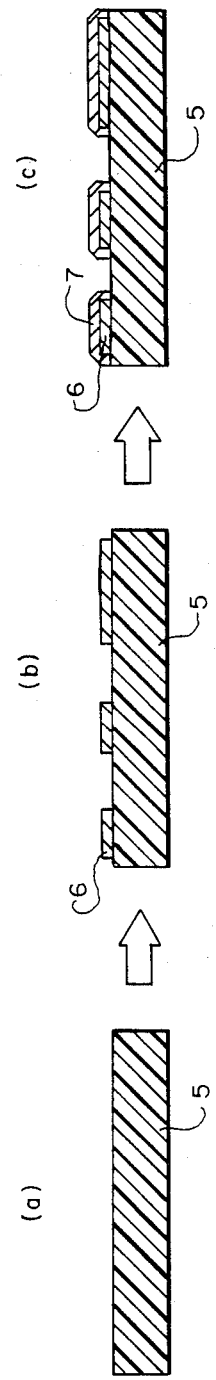

METHOD OF CONNECTING ELECTRONIC ELEMENT TO BASE PLATE

BACKGROUND OF THE INVENTION

This invention relates to a method of connecting an electronic element to a base plate without using any solder material.

Methods of connecting an electronic element to a base plate without using a solder material, or the so-called solderless connecting methods, include mechanical compression by using rubber or a so-called zebra rubber material as well as thermal compression by using a so-called anisotropic conductive adhesive material obtainable by mixing small metallic or carbon particles into an adhesive base. Base plates for these electronic elements may be produced by etching a copper plate and thereafter plating its surface with Au or Sn or by directly printing a wiring pattern with carbon or a conductive ink material such as Ni and Cu. Although a plate made by the latter method has a rather large margin of error in the wiring resistance and its wiring pitch is not very accurate. Somewhere between these two types of base plates are those obtainable by printing a wiring pattern with a conductive ink material on a polyester film or the like with a laminated or vapor deposited Al or Cu foil and thereafter etching and cleaning. With conventional wiring base plates of this type, however, oxide films tend to be formed, as time passes, between the conductive ink layer and the metallic wiring layer of Al or Cu therebelow. This phenomenon causes to reduce the adhesive force between the conductive ink material and the metallic wiring pattern, that is, the electric properties of the connected element deteriorate with time.

SUMMARY OF THE INVENTION

It is therefore an object of the present invention to provide a method of connecting an electronic element to a base plate whereby the aforementioned problems can be overcome.

The above and other objects of the present invention are achieved by providing a new method of connecting an electronic element to a wiring base plate having a pattern of metallic lines and a layer of conductive resist material formed thereon. According to the method embodying the present invention, use is made of a connecting means comprising an adhesive layer containing metallic particles dispersed therethrough which are larger than the thickness of this layer of conductive resist material and the electronic element and the wiring plate are joined together by thermal compression with this connecting means sandwiched therebetween.

BRIEF DESCRIPTION OF THE DRAWINGS

The accompanying drawings, which are incorporated in and form a part of the specification, illustrate embodiments of the present invention and, together with the description, serve to explain the principles of the invention. In the drawings.

DETAILED DESCRIPTION OF THE INVENTION

Figure 1:
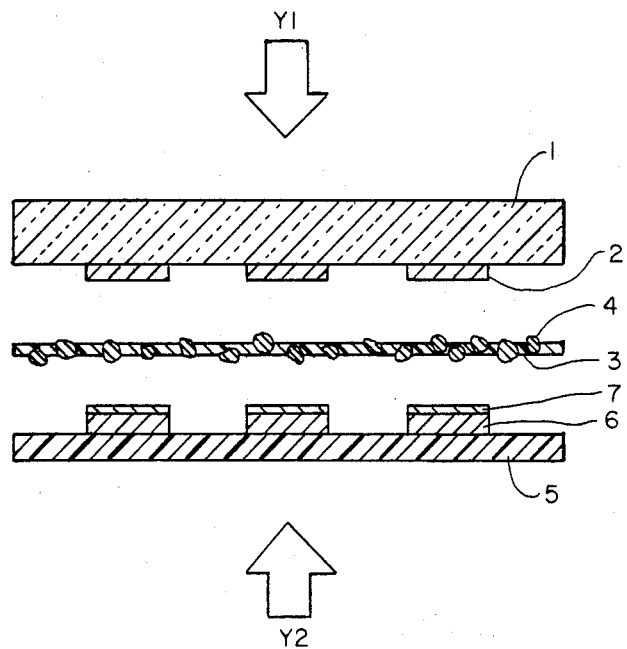
FIG. 1 is a drawing which shows the basic principle of a method embodying the present invention.

In what follows, a method embodying the present invention is described by way of an example wherein two kinds of base plates are connected together. With reference to FIG. 1, numeral 1 indicates a glass epoxy plate on the surface of which is an electroconductive pattern 2 of thickness about 30–35 $\mu$m formed by etching a copper foil and plating with Sn. Numeral 5 indicates another base plate in the form of a polyester film on the surface of which are another electroconductive pattern 6 of thickness about 9 $\mu$m made from an Al foil and an overcoating layer 7 of thickness about 10–15 $\mu$m formed on this conductive pattern 6 by printing with thermosetting carbon ink. Numeral 3 indicates an adhesive layer in the form of a tape with thickness about 10–20 $\mu$m containing many metallic particles 4, for example, of Ni dispersed throughout within the adhesive layer 3. The size of these metallic particles 4 is greater layer 7, being about 30–40 $\mu$m.

When these two plates are connected, their base plates 1 and 5 are properly positioned with respect to each other such that the conductive patterns 2 and 6 thereon are in mutually matching relationship. The adhesive layer 3 with the metallic particles 4 dispersed therethrough is sandwiched between the plates 1 and 5. Thereafter, the entire combination is heated while the base plate 1 is pressed in the direction of the arrow Y1 and the other base plate 5 is pressed in the direction of the arrow Y2, the conductive patterns 2 and 6 thereupon being thermally compressed to each other with the adhesive layer 3 therebetween. The compressive pressure on the plates 1 and 5 is about 20–60 kg/cm$^2$ and the combination is maintained at a temperature of about 130–180° C. This thermal compression process takes about 5–10 seconds.

Figure 2:
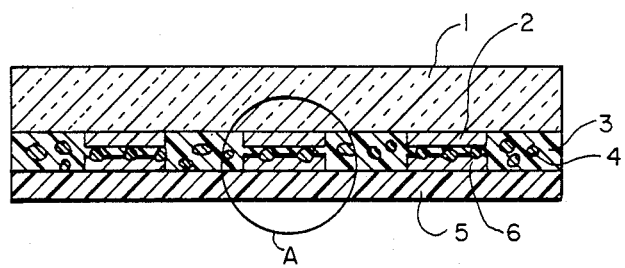
FIG. 2 is a schematic sectional view of an electronic element connected to a base plate by using a method according to the present invention.
Figure 3:
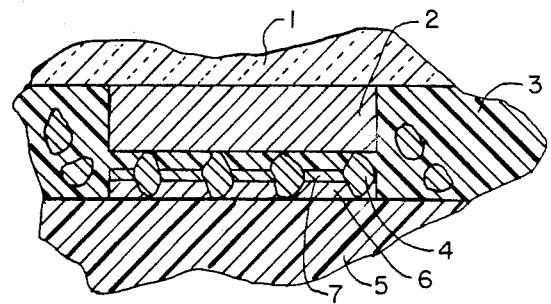
FIG. 3 is an enlarged view of a portion of FIG. 2, and FIGS. 4 and 5 are drawings for explaining methods of making the base plate shown in FIGS. 1–3.

With heat and pressure applied as explained above, a plastic flow takes place inside the adhesive layer 3 and the adhesive layer 3 comes to fill the space between the two base plates 1 and 5 as shown in FIG. 2 and, more in detail, in FIG. 3. In this process, those of the metallic particles 4 between the conductive patterns 2 an 6 not only penetrate the overcoating layer 7 to invade the conductive pattern 6 therebelow but also invade the other conductive pattern 2 on the opposite side. Plates thus connected were tested and it was found that the resistance can be maintained below 1$\Omega$ after 1000 hours of use if Ni particles are used and below 100$\Omega$ if carbon particles are used.

Comparison tests were also carried out to determine the effect of the size of the metallic particles contained in the adhesive layer 3 by reducing it to less than the thickness of the overcoating layer 7, or less than 10 $\mu$m. It was discovered that resistance became greater than 1–10 k$\Omega$ even if Ni particles are used. This is because small metallic particles cannot penetrate the overcoating layer 7 and oxide films of Al are formed between the overcoating layer 7 and the conductive pattern 6. If the metallic particles 4 are made sufficiently larger, they can not only penetrate the overcoating layer 7 but invade deeply into the conductive pattern 6 while the carbon ink material of the overcoating layer 7 covers the surrounding areas protectingly, thereby preventing the Al foil of the conductive pattern 6 from becoming oxidized.

Although the present invention was described above by way of an example wherein a tape-like adhesive layer containing uniformly dispersed metallic particles is used by inserting it between two base plates, the present invention is not intended to be limited by this mode of use of an adhesive layer. As an alternative method, an adhesive layer may be formed by preparing an ink material containing an adhesive and Ni particles or a carbon filler and applying such an ink material by a printing process to a thickness of about 10–25 μm on a base plate on which a conductive pattern and an overcoating layer are formed.

Methods of producing a base plate of the type shown at 5 in FIGS. 1–3 with the substrate metallic conductor pattern 6 and the overcoating layer 7 thereon are explained next by way of FIGS. 4 and 5. According to the method illustrated by FIG. 4, a conductive metallic foil 6 is formed first on the surface of the base plate 5 (a) and the conductive overcoating layer 7 is formed according to a pattern by thick-film printing with a conductive paste (b). Thereafter, the conductive metallic foil is etched according to the pattern (c). The conductive metallic pattern thus formed has its surface protected by the conductive paste 7 and can be used directly as a wiring pattern.

FIG. 5 shows an example of double thick-film printing method. First, a pattern is printed on a base plate 5 with a metallic paste of Ag, Cu, Ni or the like with low resistance to form a substrate metallic conductive pattern 6 (a)–(b). Thereafter, a conductive paste 7 is deposited by printing on this substrate metallic conductive pattern 6 in order to prevent oxidation and corrosion of the surface of this substrate metallic conductive pattern 6 and also to prevent the migration phenomena (c). From the point of view of cost and stability in the product quality, carbon paste is commonly used for the conductive overcoating layer 7.

The foregoing description of preferred embodiments of the invention has been presented for purposes of illustration and description. It is not intended to be exhaustive or to limit the invention to the precise form disclosed, and many modifications and variations are possible in light of the above teaching. For example, the present invention was described above as being applied to a base plate using a metallic foil to form a substrate metallic conductive pattern and a conductive resist formed thereon but this is not intended to limit the present invention. Base plates of a polyester film and paper phenol may be used. Low-resistance metallic paste of silver-carbon or copper-carbon may be used to form lines and a conductive resist of carbon paste or the like may be deposited thereon by a double printing process. In such a case, the metallic particles contained in the adhesive layer penetrate the conductive resist to invade the lines made of low-resistance metallic paste and the conductive resist serves to cover the surrounding areas of the metallic particles protectingly. In summary, electronic elements can be connected according to the present invention by a thermal compression process through an adhesive layer containing metallic particles which are larger than the thickness of the conductive resist layer on the base plate such that not only do these metallic particles penetrate the conductive resist and invade the metallic foil but also the conductive resist covers the surrounding areas around the metallic particles protectingly. Thus, conductor parts can be securely connected and the metallic foils can be prevented from oxidizing. As a result, the low-resistance connection made possible by the present invention can last semi-permanently.

What is claimed is:

1. A method of connecting an electronic element to a base plate comprising the steps of
   forming a conductive pattern on said base plate and a conductive resist layer superposingly on said conductive pattern,
   placing a connecting means between said base plate and said electronic element, said connecting means comprising an adhesive layer having metallic particles dispersed therethrough, said metallic particles being larger than the layer thickness of said resist layer, and
   thermal compression of said base plate and said electronic element against each other with said connecting means sandwiched therebetween.

2. The method of claim 1 wherein said step of thermal compression is carried out with pressure of 20–60 kg/cm$^2$ at temperature 130–180° C. for 5–10 seconds.

3. The method of claim 1 wherein said step of thermal compression is carried out such that said metallic particles penetrate said conductive resist layer and invade sai conductive pattern.

4. The method of claim 1 wherein said base plate comprises a polyester film, said conductive pattern is formed from an aluminum foil and is about 9 μm in thickness and said conductive resist layer is about 10–15 μm in thickness.

5. The method of claim 4 wherein said connecting means is shaped like a tape, having thickness of about 10–30 μm.

6. The method of claim 5 wherein said metallic particles comprise Ni and are about 30–40 μm in size.

7. The method of claim 4 wherein said conductive resist layer comprises thermosetting carbon ink.

8. The method of claim 1 wherein said conductive pattern is formed by etching an aluminum foil formed on said base plate.

9. The method of claim 1 wherein said conductive pattern comprises a low-resistance metallic paste material and is deposited on said base plate by printing.

10. The method of claim 8 wherein said conductive resist layer is formed by printing a conductive paste material on said conductive pattern.

* * * * *